United States Patent [19]

Nakamura

[11] Patent Number: 5,126,689
[45] Date of Patent: Jun. 30, 1992

[54] DIRECT-COUPLED GROUNDED-BASE AMPLIFIER, SEMICONDUCTOR DEVICE AND INFORMATION PROCESSING DEVICE HAVING THE AMPLIFIER THEREIN

[75] Inventor: Hiroyuki Nakamura, Atsugi, Japan

[73] Assignee: Canon Kabushiki Kaisha, Tokyo, Japan

[21] Appl. No.: 614,374

[22] Filed: Nov. 16, 1990

[30] Foreign Application Priority Data

Nov. 22, 1989 [JP] Japan ............................. 1-302222

[51] Int. Cl.5 .................... H03F 3/343; H04N 9/24
[52] U.S. Cl. ............................... 330/296; 330/310; 330/311; 360/67
[58] Field of Search ............... 330/296, 307, 310, 311, 330/67, 68

[56] References Cited

U.S. PATENT DOCUMENTS 4,716,305 12/1987 Sakuragi et al. .............. 307/296
4,758,820 7/1988 Tateno ........................... 340/347

FOREIGN PATENT DOCUMENTS 2126031 3/1984 United Kingdom ............ 330/311

*Primary Examiner*—James B. Mullins
*Attorney, Agent, or Firm*—Fitzpatrick Cella, Harper & Scinto

[57] ABSTRACT

A direct-coupled grounded-base amplifier comprising two or more grounded-base amplifying circuits. The same circuit used as the output stage of a first grounded-base amplifying circuit is mounted in each of second and subsequent grounded-base amplifying circuits. The base potentials of output stges of the second and subsequent grounded-base amplifying circuits are applied by the same circuit, thereby equalizing the DC potentials at both ends of an input resistor of the second and subsequent grounded-base amplifying circuits. Therefore, a capacitor outside of the IC is unnecessary.

8 Claims, 6 Drawing Sheets

DIRECT-COUPLED GROUNDED-BASE AMPLIFIER, SEMICONDUCTOR DEVICE AND INFORMATION PROCESSING DEVICE HAVING THE AMPLIFIER THEREIN

BACKGROUND OF THE INVENTION

1. Field of the Invention

The present invention relates to a direct-coupled grounded-base amplifier for use in an information processing device and a semiconductor integrated circuit device.

2. Related Background Art

As a conventional direct-coupled grounded-base amplifier used in a semiconductor integrated circuit, the circuit in FIG. 1 is known.

Referring to FIG. 1, the circuit is composed of a power supply line 1, a GND line 2, a power supply 3 for applying a reference voltage to a base of a grounded-base amplifier 12, resistors 4a to 4c and 5 to 8, a condenser 10, NPN transistors 11 to 14, constant current sources 17 to 21 and a condenser 25 mounted outside of an integrated circuit (IC).

The direct-coupled grounded-base amplifier shown in FIG. 1 is constituted by two grounded-base amplifying circuits. In other words, signals amplified by a first amplifying circuit, including the NPN transistors 11 and 12, the resistors 4a, 4b, 5 and 6 and the constant current sources 17 and 18, are further amplified by a second amplifying circuit, including the NPN transistors 13 and 14, the resistors 4c, 7 and 8, the constant current sources 20 and 21 and the condenser 25, and output from the NPN transistor 15.

However, in the above conventional circuit, as shown in FIG. 1, it is necessary to mount the capacitor 25 outside of the IC in order to equalize the direct potentials at both ends of the input resistor 7 of the grounded-base amplifier 14. Therefore, the PIN number of the IC is increased, the band is deteriorated by PAD parasitic capacitor, and furthermore, the number of components are increased.

SUMMARY OF THE INVENTION

An object of the present invention is to provide a direct-coupled grounded-base amplifier which has an extremely simple composition and in which the band is not deteriorated, and a semiconductor device and an information processing device having the amplifier therein.

Another object of the present invention is to provide a direct-coupled grounded-base amplifier which has two or more grounded-base amplifying circuits and in which the same circuit used as an output stage of a first grounded-base amplifying circuit is mounted in each of second and subsequent grounded-base amplifying circuits. Further, the base potentials of the output stages of the grounded-base amplifying circuits are applied by the same circuit as the output stage of the first grounded-base amplifying circuit.

According to the present invention, by applying the base potentials of the output stages of the second and subsequent grounded-base amplifying circuits by a circuit having the same composition as that of the output stage of the first grounded-base amplifying circuit, the DC potentials at both ends of an input resistor of the second and subsequent grounded-base amplifying circuits are made equal to each other. In other words, according to the present invention, since such a composition makes the capacitor outside of the IC unnecessary, it is possible to solve the above-mentioned conventional problems.

DETAILED DESCRIPTION OF THE PREFERRED EMBODIMENTS

A direct-coupled grounded-base amplifier having two grounded-base amplifying circuits will now be described as an embodiment of the present invention.

Figure 1:
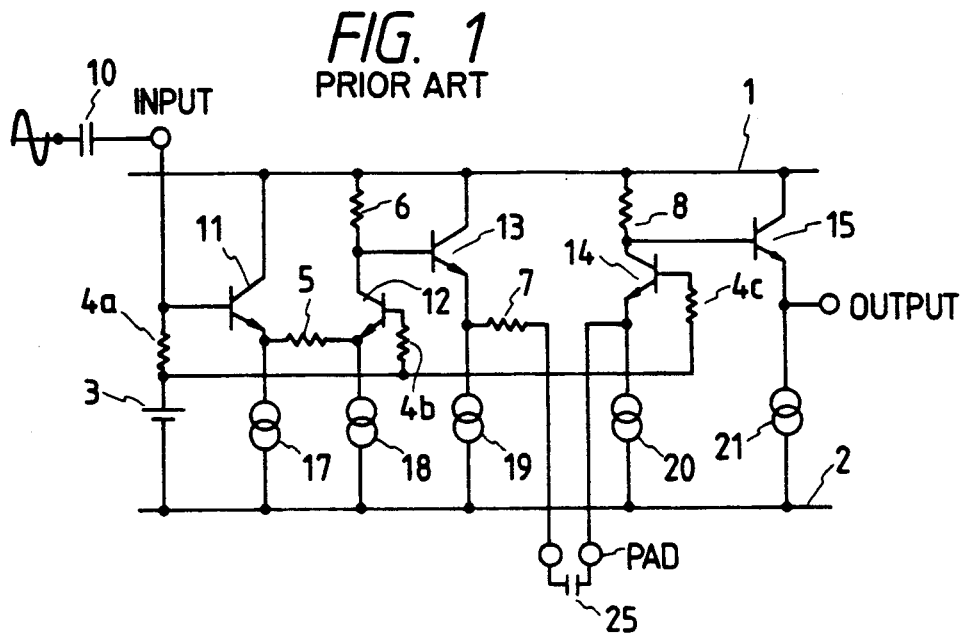
FIG. 1 is a circuit diagram of a conventional direct-coupled grounded-base amplifier.
Figure 2A:
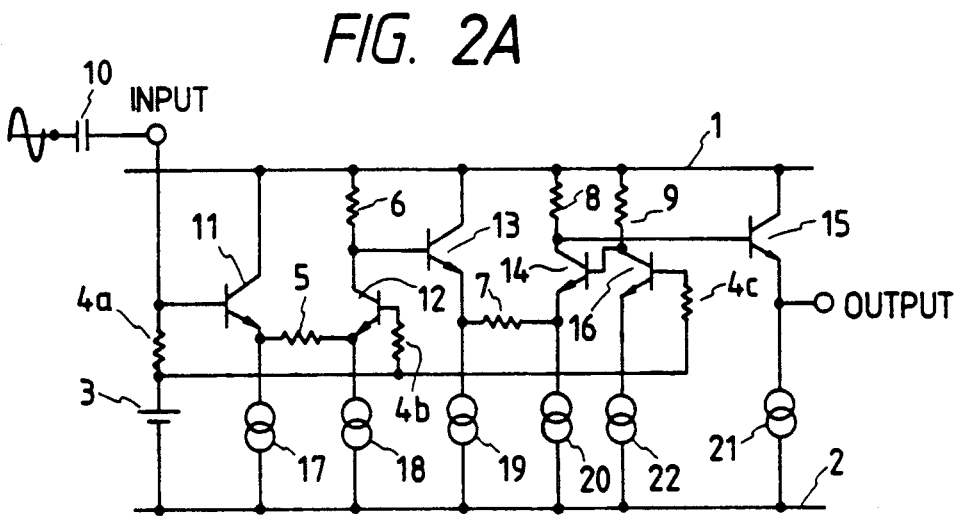
FIG. 2A is a circuit diagram of a direct-coupled grounded-base amplifier according to an embodiment of the present invention.

FIG. 2A is a circuit diagram of a direct-coupled grounded-base amplifier of the embodiment.

Referring to FIG. 2A, numerals 1, 2, 3 denote a power supply line, a GND line and a constant voltage source, respectively.

A first amplifying circuit is composed of an input stage including a grounded-collector transistor 11, a resistor 4a and a constant current source 17 and an output stage including an input resistor 5 of the first amplifying circuit, a grounded-base transistor 12, resistors 4b and 6 and a constant current source 18.

A second amplifying circuit is composed of an input stage including an NPN transistor 13 and a constant current source 19, an output stage including an input resistor 7, an NPN transistor 14, a resistor 8 and a constant current source 20, and a circuit including a grounded-base transistor 16, resistors 4c and 9 and a constant current source 22 and for applying the base potential of the output stage.

The output stage of the first amplifying circuit and the circuit for applying the base potential of the output stage of the second amplifying circuit constitute the same circuit. Therefore, the resistance values of the resistors 4b and 4c, the resistance values of the resistors 6 and 9 and the current values of the constant current sources 18 and 22 are equal to each other, respectively.

Numeral 15 denotes an emitter follower NPN transistor which functions as a buffer for taking the output of the second amplifying circuit out, and numeral 21 denotes a constant current source.

Figure 2B:
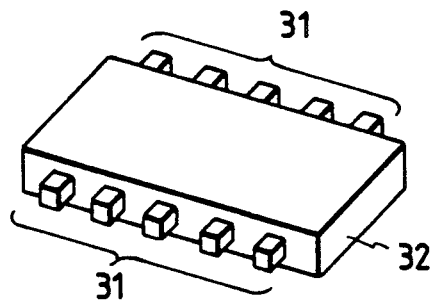
FIG. 2B is a schematic perspective view of a semiconductor device in which the circuit shown in FIG. 2A is incorporated.

FIG. 2B is a schematic perspective view of a semiconductor device in which the circuit shown in FIG. 2A is incorporated.

Operations of the circuit shown in FIG. 2A will now be described.

When a signal is applied from an end of the condenser 10, a signal, in which the voltage $V_{BE}$ applied from the reference power supply 3 is converted into the DC level, is applied to the base of the transistor 11, and a signal which is shifted by 1 $V_{BE}$ level appears in an emitter of the transistor 11. Since the DC level of the emitter of the transistor 12 and that of the emitter of the transistor 11 are equal to each other, only an AC element of the signal is converted into the current by the resistor 5 and returned to the voltage by the resistor 6. The amplification factor $A_1$ at this time is determined as follows:

$$A_1 = R_6/R_5$$

$R_5$: the amount of the resistor 5
$R_6$: the amount of the resistor 6

The signal amplified by the first grounded-base amplifying circuit is applied to the resistor 7 by the transistor 13. If the resistance values of the resistors 4b and 4c, and the resistance values of the resistors 6 and 9, the current values of the constant current sources 18 and 22 and the current values of the constant current sources 19 and 20 are equal to each other, respectively, the base potential of the transistor 14 is equal to that of the transistor 13. Therefore, the DC levels of both ends of the resistor 7 are equal to each other, and only an AC element of the signal is converted into the current by the resistor 7 and output by the output buffer 15. The amplification factor $A_2$ at this time is determined as follows:

$$A_2 = R_8/R_7$$

$R_7$: the amount of the resistor 7
$R_8$: the amount of the resistor 8

As described above, since the DC levels at both ends of the input resistor 7 of the second grounded-base amplifying circuit can be made equal by using the same circuit as the output stage of the first grounded-base amplifying circuit as a means for applying the base potential to the NPN transistor 14 of the second grounded-base amplifying circuit, it is possible to prevent gain errors due to the mismatch of the DC levels. Furthermore, since it is unnecessary to mount the capacitor outside of the IC, the PIN number is not increased and it is possible to prevent the band from being deteriorated by the PAD parasitic capacitor. In addition, since no components mounted outside are necessary, the cost can be reduced.

A constant-current circuit suitable for applying a constant current to the above direct-coupled grounded-base amplifier will be described with reference to FIGS. 3 and 4.

Figure 3A:
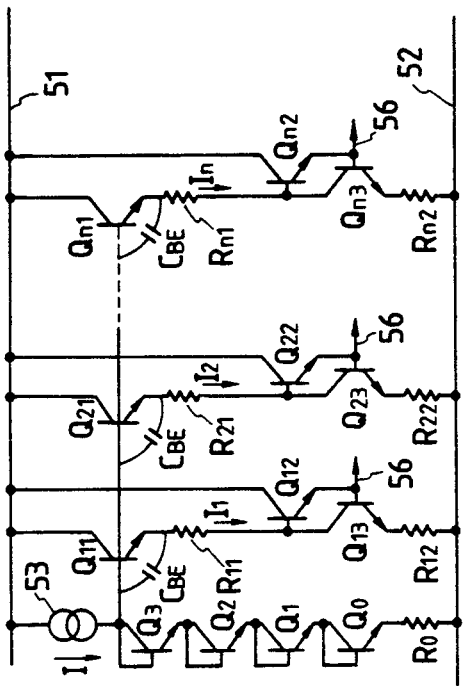
FIGS. 3A and 3B are circuit diagrams showing the composition of a constant current circuit.
Figure 3B:
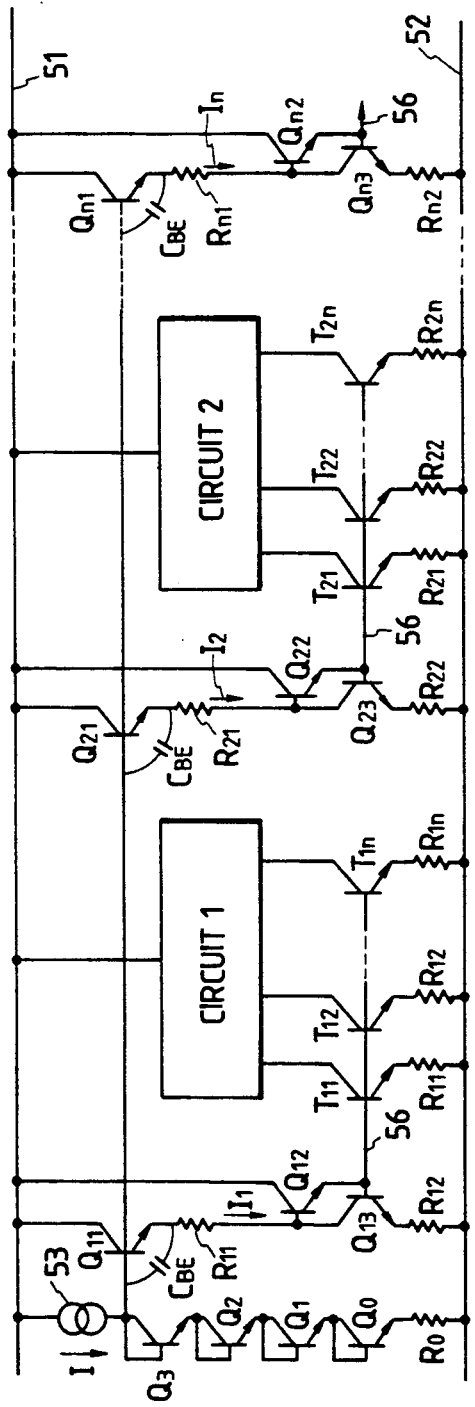

FIG. 3A shows a basic composition of the circuit and FIG. 3B is a view including circuits 1 and 2 to be driven in order to make the features of the present invention clear.

Referring to FIGS. 3A and 3B, the constant-current circuit comprises a power supply line 51, a GND line 52 and a constant current source 53. $C_{BE}$ represents parasitic capacity in the base emitter.

NPN transistors $Q_{11}$ to $Q_{n1}$ may be utilized in applications requiring separate circuits not to be interfered with by each other, such as driving circuits for an optical or a magnetic head. Bases of the NPN transistors $Q_{11}$ to $A_{n1}$ are connected to a collector and a base of the NPN transistor $Q_3$ for applying the bias and one end of the constant current source 53, respectively. Collectors of the NPN transistors $Q_{11}$ to $A_{n1}$ are connected to the power supply line 51, respectively.

One end of each resistor $R_{11}$ to $R_{n1}$ is connected to emitters of the NPN transistors $Q_{11}$ to $Q_{n1}$ respectively, and the other ends thereof are connected to bases of NPN transistors $Q_{12}$ to $Q_{n2}$ and to collectors of NPN transistors $Q_{13}$ to $Q_{n3}$, respectively.

Emitters of NPN transistors $Q_{13}$ to $Q_{n3}$ are connected to one end of resistors $R_{12}$ to $R_{n2}$, respectively, and the other ends thereof are connected to the GND line 52, respectively.

The constant current source 53, transistors $Q_0$ to $Q_3$ and a resistor $R_0$ constitute a constant-voltage circuit, which maintains a constant potential difference between the bases of the transistors $Q_{11}$ to $Q_{n1}$ and the GND line 52. An emitter of the transistor $Q_3$ is connected to a collector and a base of the transistor $Q_2$, and an emitter of the transistor $Q_2$ is connected to a collector and a base of the transistor $Q_1$, an emitter of the transistor $Q_1$ is connected to a collector and a base of the transistor $Q_0$, an emitter of the transistor $Q_0$ is connected to one end of the resistor $R_0$, and the other end of the resistor $R_0$ is grounded.

A bias line 56 is mounted to apply a constant current for driving the circuit blocks 1, 2 and so on. The driven circuits are connected to the transistors $Q_{13}$ and $Q_{23}$ and bases of a plurality of NPN transistors ($T_{1l}$ to $T_{1n}$ and $T_{2l}$ to $T_{2n}$ shown in FIG. 3B) constituting a current mirror.

In the constant-current circuit shown in FIG. 3, if the current of the constant current source 53 is I[mA] and the emitter currents of the NPN transistors $Q_{1l}$ to $Q_{n1}$ are $I_1$ to $I_n$[mA], since the forward voltages of the diode-connected NPN transistors $Q_1$, $Q_2$ and $Q_3$ and the forward voltages of the NPN transistors $Q_{11}$, $Q_{12}$, $Q_{13}$ to $Q_{n1}$, $Q_{n2}$ and $Q_{n3}$ offset each other, the following equation is valid;

$$R_0 \cdot I_0 + V_{BE(Q0)} = (R_{11}+R_{12})I_1 = (R_{21}+R_{22})I_2 = \ldots = (R_{n1}+R_{n2})I_n$$

By selecting proper values for $R_0$ and $I_0$, it is possible to make the left side of the above equation a bandgap voltage value. In other words, if the bandgap voltage is $V_{BG}$:

$$(R_{n1}+R_{n2})I_n = V_{BG}$$

$[V_{BG} = 1.2$ to $1.3$ V (bandgap voltage of a single crystal Si)]

Therefore, $$I_n = V_{BG}/R_{n1} 30 \; R_{n2}(R_0 = R_{12} = R_{22} = \ldots R_{n2})$$

and the constant current value can be determined.

As described above, in this embodiment, the constant current source 53, the transistors $Q_0$ to $Q_3$, and the resistor $R_0$, constitute a constant-voltage circuit on the basis of the GND line 52, and the emitter-base capacity of a plurality of NPN transistors constituting a current mirror intervenes in the bias line. Therefore, since the emitter-base capacity is normally more than one digit smaller than the collector-base capacity, it is possible to decrease the influence of noise even more than in a conventional constant-current circuit.

For example, even if the circuit blocks 1 and 2 treat a driving signal having the peak-to-peak voltage of 4 V and 10 MHZ, no influence can be found in the signal.

Although the constant-current circuit composed of the NPN transistors is described in the above embodiment, it is apparent that the same effect can be obtained even if the circuit is composed of PNP transistors.

Figure 4A:
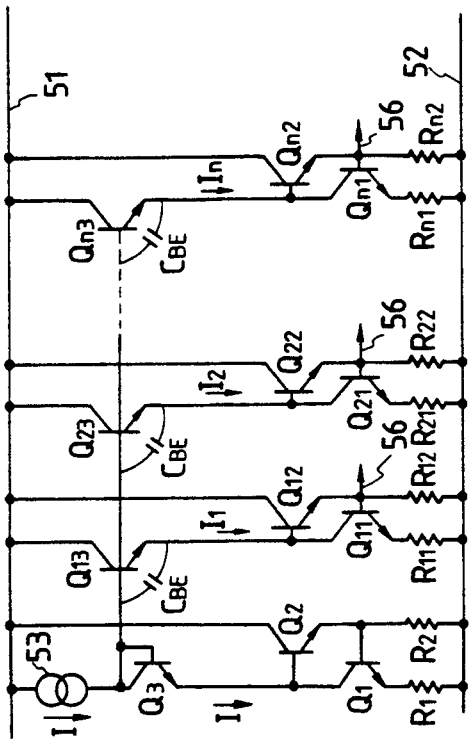
FIGS. 4A and 4B are circuit diagrams showing the composition of another constant current circuit.
Figure 4B:
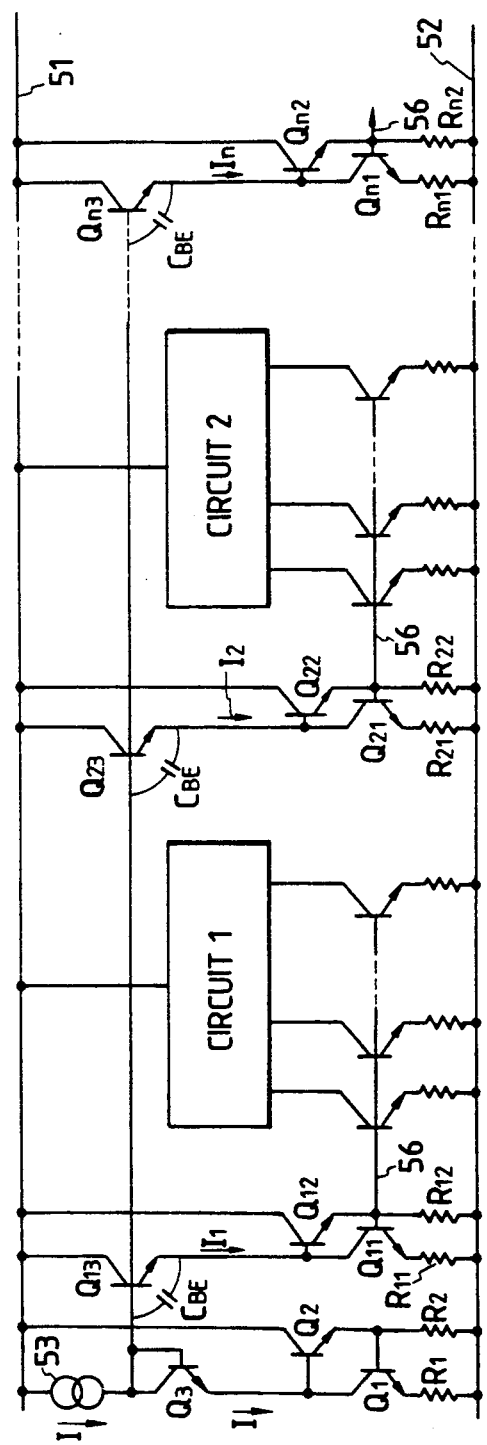

Another embodiment of a constant-current circuit will now be described with reference to FIGS. 4A and 4B. In FIG. 4, the same numerals as those in FIG. 3 denote the same components. FIG. 4B shows the circuit shown in FIG. 4A with circuits 1 and 2 to be driven. In the constant-current circuit shown in FIG. 4, the constant current I is converted into a constant voltage by NPN transistors $Q_1$, $Q_2$ and $Q_3$ and resistors $R_1$ and $R_2$. In other words, the potential $V_B$ between a base and a collector, which are short-circuited, of the NPN transistor $Q_3$ is found as follows:

$$V_B = R_1 I + V_{BE(Q1)} + V_{BE(Q2)} + V_{BE(Q3)}$$

The resistor $R_2$ is intended for assuring the operations of the NPN transistor $Q_2$.

According to such a composition of the circuit, the base potentials of $Q_{13}$, $Q_{23}$ . . . $Q_{n3}$ are equal and the following equation is valid:

$$\begin{aligned} V_B &= R_1 I_1 + V_{BE(Q1)} + V_{BE(Q2)} + V_{BE(Q3)} \\ &= R_n I_n + V_{BE(Qn1)} + V_{BE(Qn2)} + V_{BE(Qn3)} \end{aligned}$$

If the current amplification factor of the NPN transistors is sufficiently large, $V_{BE}$ of $Q_2$, $Q_{12}$ and $Q_{n2}$ for supplying the bias current are equal and the collector currents of $Q_1$ and $Q_3$ and the collector currents of $Q_{n1}$ and $Q_{n3}$ are equal respectively, the above equation is converted as follows:

$$R_1 I_1 + 2 V_{BE(Q1)} = R_n I_n + I_n + 2 V_{BE(Qn1)}$$

Then, the constant current value $I_n$ can be found from the following equation:

$$R_n I_n + kT/q \cdot I_n \cdot I_n / I_1 = R_1 I_1$$

In the case in which the constant-current circuit is composed as described above, the collector-base capacity of a plurality of NPN transistors constituting a current mirror does not intervene and the emitter-base capacity $C_{BE}$ intervenes, unlike the conventional constant-current circuit.

Furthermore, although the constant-current circuit is also composed of NPN transistors in this embodiment, it is apparent that the same effect can be obtained if the circuit is composed of PNP transistors.

Referring to FIG. 2A, the transistors 11, 13 and 15 function as emitter followers and the transistors 12 and 14 function as grounded-base amplifiers. In other words, the current in the constant current sources 17, 19 and 21 connected to the transistors 11, 13 and 15 change in the same manner as the signal. On the contrary, the constant current sources 18 and 20 connected to the grounded-base amplifiers 12 and 14 are required to make the collector potentials of the transistors, which constitute a constant-current circuit and whose collectors are connected to the amplifiers 12 and 14, constant in order to obtain the linearity of the amplifiers 12 and 14. Therefore, isolating the alternating current between the constant current sources 17, 19 and 21 and the constant current sources 18 and 20 is necessary. In other words, if the base lines of the constant current sources 17, 18, 19, 20 and 21 are common, since the bias of the constant current sources 18 and 20, which should be constant, is changed by the base-collector capacity, a high-precision signal transmission is impossible.

In this embodiment, by constituting the constant current sources 17, 18, 19, 20 and 21 by transistors connected to an independent bias line 56 (See FIGS. 3A to 4B), the bias is prevented from being changed and a high-precision signal transmission is made possible.

The above-mentioned FIG. 2B can be applied to a semiconductor integrated circuit device including the above constant-current circuit. In the device, a circuit is formed on a single crystal silicon substrate with semiconductor processing technique, lead terminals 31 for connecting the circuit and the outside circuit are connected through fine gold wires by wire bonding, and the device is contained in a ceramic package 32.

Figure 5:
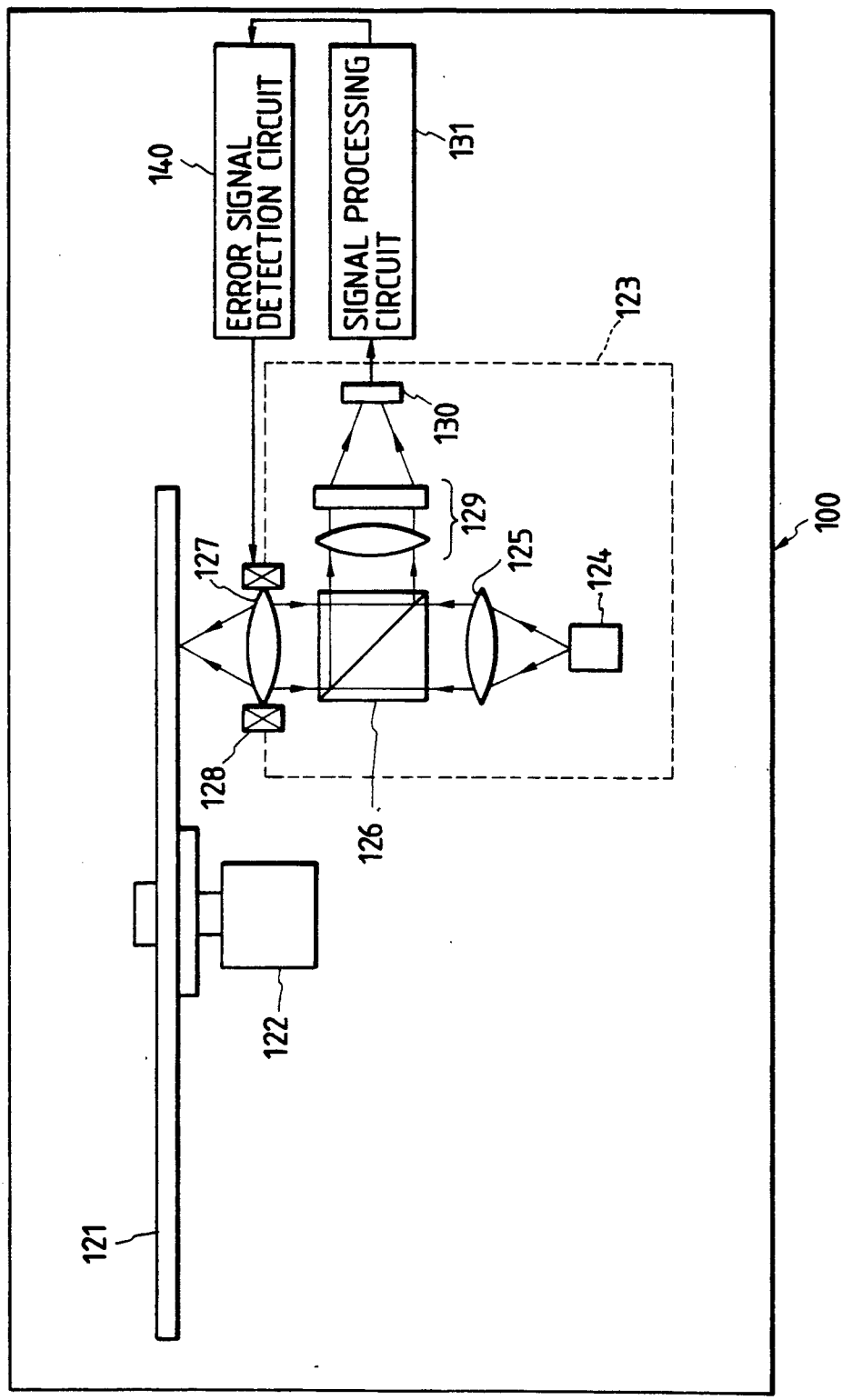
FIG. 5 is a schematic view of a recording and reproducing apparatus as an embodiment of the present invention.

FIG. 5 is a schematic view of an apparatus which contains a semiconductor integrated circuit device having the above constant-current circuit. A recording and reproducing apparatus using an optical disk will be described as an embodiment.

Referring to FIG. 5, numeral 121 denotes an optical disk as a recording medium. The optical disk 121 is laid on a turntable as a supporting means for supporting the recording medium and rotated by a spindle motor 122. An optical head 123 is mounted movably in the radial direction of the rotating optical disk 121, and emits a light beam from a semiconductor laser 124 built therein toward the optical disk 121. The emitted light beam is collimated by a collimator lens 125, passes through a beam splitter 126 and is imaged onto the optical disk 121 as a fine spot by an objective lens 127. Information is recorded and/or reproduced onto the optical disk 121 by the light beam.

On the other hand, the light reflected by the optical disk 121 passes through the objective lens 127 and an incident light beam is separated from the reflected light by the beam splitter 126. The separated reflected light passes through an anamorphic optical system 129 in which an imaging position differs in two orthogonal directions, and is received by a photoelectric conversion device 130. The photoelectric conversion device 130 is composed of a plurality of light sensor portions. The output currents of the light sensor portions are converted into voltage by a signal processing circuit 131. A focusing error signal and a tracking error signal are generated from the converted voltage by an error signal detection circuit 140.

The focusing error signal is intended for precisely focusing the light beam radiated onto the optical disk 121. An actuator 128 mounted in the optical head 123 moves the objective lens 127 in its axial direction according to the focusing error signal and controls the focusing. The tracking error signal is intended for making such a control that the light beam precisely traces an information track concentrically or spirally formed on the optical disk 121. The tracking error signal is also fed back to the actuator 128 and used to move the objective lens 127 in the direction across the information track. A method for detecting these error signals will now be described.

Figure 6A:
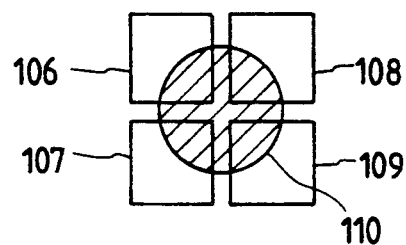
FIGS. 6A to 6C are schematic front views of a photoelectric conversion device shown in FIG. 5.
Figure 6B:
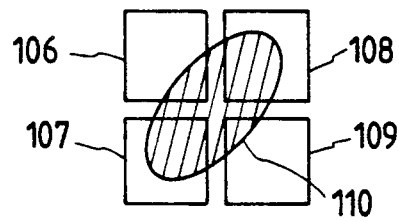
Figure 6C:
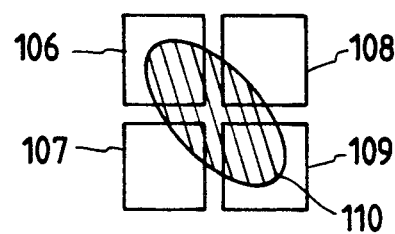

FIGS. 6A to 6C are front views of the photoelectric conversion device 130 shown in FIG. 5. The photoelectric conversion device 130 is composed of four light sensor portions 106 to 109, and the reflected light from the optical disk becomes incident as a spot 110, shown by the shaped portion, into a light receiving portion of the photoelectric conversion device 130. The shape of the spot 110 changes in accordance with the focusing state of the light beam radiated onto the optical disk. If the light beam is precisely imaged onto the disk, the spot 110 is formed into a circle as shown in FIG. 6A and equal currents are output from the light sensors 106 to 109 respectively. If the light beam is imaged before or behind the disk, the spot 110 becomes elliptic as shown in FIGS. 6B and 6C respectively. Therefore, it is possible to obtain a focusing error signal from a difference signal between the total output of the light sensor portions 107 and 108 and the total output of the light sensor portions 106 and 109.

On the other hand, a shading pattern is formed on the spot 110 in accordance with the positional relationship between the light beam radiated onto the disk and the information track. A boundary line of light sensor portions 106 and 107 and the light sensor portions 108 and 109 is disposed in parallel with the longitudinal direction of the image formed by the reflected light on the information track. Therefore, by differentiating the sum signal of the outputs of the light sensor portions 106 and 107 and the sum signal of the outputs of the light sensor portions 108 and 109, a tracking error signal is detected.

Figure 7:
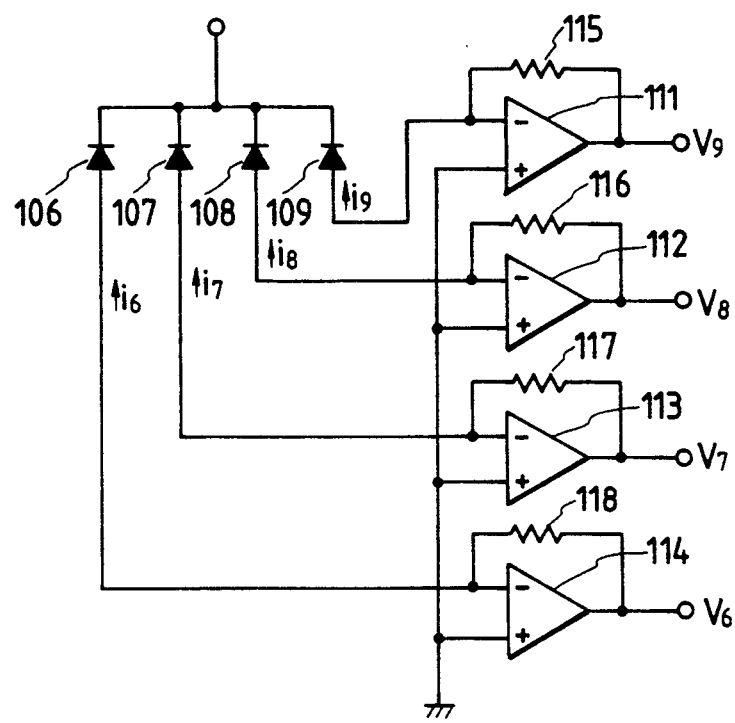
FIG. 7 is a partial schematic view of a signal processing circuit shown in FIG. 5.

FIG. 7 is a view showing the composition of a conventional signal processing circuit for converting the output current of the photoelectric conversion device into the voltage. Referring to FIG. 7, the circuit is composed of differential amplifiers 111, 112, 113 and 114 and resistors 115, 116, 117 and 118 each having the same resistance value R. The currents $i_6$, $i_7$, $i_8$ and $i_9$ flowing through the light sensor portions 106, 107, 108 and 109 composed of photodiodes or the like are converted to the voltages corresponding to the amount of the currents respectively by this circuit. When the output voltages of the operational amplifiers 111, 112, 113 and 114 are $V_9$, $V_8$, $V_7$ and $V_6$, respectively, the following relationship are valid:

$$V_6 = R \cdot i_6, \quad V_7 = R \cdot i_7, \quad V_8 = R \cdot i_8, \quad V_9 = R \cdot i_9$$

Figure 8:
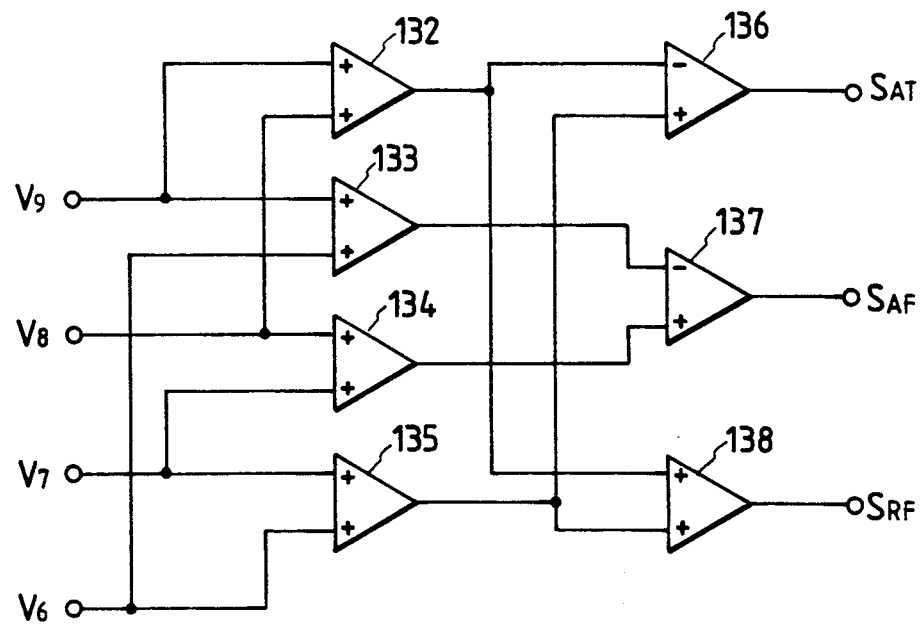
FIG. 8 is a schematic view of an error signal detection circuit shown in FIG. 5.

FIG. 8 is a view of an error signal detection circuit for detecting the above focusing error signal and the tracking error signal from the output voltage of the signal processing circuit shown in FIG. 7. The error signal detection circuit is composed of summing amplifiers 132, 133, 134 and 135 and differential amplifiers 136 and 137. The focusing error signal $S_{AF}$ is obtained as an output of $(V_7+V_8)-(V_6+V_9)$ from the differential amplifier 137. On the other hand, the tracking error signal $S_{AT}$ is output as $(V_6+V_7)-(V_8+V_9)$ from the differential amplifier 136. The sum signal $S_{RF}$ of $V_6+V_7+V_8+V_9$ is output from the summing amplifier 138. The sum signal $S_{RF}$ is proportional to the total amount of received light of the four light sensor portions. $S_{RF}$ is used to detect that the disk plane comes near the focusing position in controlling the focusing. Furthermore, the sum signal is used to judge whether the light beam radiated onto the disk is positioned on the information track or in the region between the information tracks (what is called judgement of on-land or on-group). If the information already recorded on the optical disk is reproduced, the information signal can be reproduced from the sum signal $S_{RF}$.

The semiconductor integrated circuit device including the above constant-current circuit constitutes a part of the above signal processing circuit 131 as a signal peak detector.

As described in detail in the above embodiment, the interference between the circuit blocks can be reduced by separating the constant-current source of each circuit block with its reliance upon the use the base-emitter forward voltage of the transistor. Therefore, according to the present invention, it is possible to provide a constant-current circuit which can assure precise operations when laid in a recording and reproducing apparatus executing excellent signal processing.

As described above, according to the present invention, by applying the base potential of second and subsequent grounded-base amplifying circuits with the same circuit used as the output portion of a first grounded-base amplifying circuit in a semiconductor integrated circuit including more than two grounded-base amplifying circuits, it is possible to make the DC levels at both ends of the input gain resistor equal in accordance with changes in the temperature and the power supply. Therefore, since it is unnecessary to mount the capacitor outside of the IC, it is possible to prevent the PIN number from increasing and prevent the band from being deteriorated by the parasitic capacity accompanying the PAD. Furthermore, since components to be mounted outside are not necessary, the cost can be reduced.

I claim:

1. A direct-coupled grounded-base amplifier comprising first and second grounded-base amplifying circuits and a bias circuit for applying a bias potential to said second grounded-base amplifying circuit, wherein said bias circuit has the same configuration as an output stage of said first grounded-base amplifying circuit.

2. A circuit device comprising:
   a direct-coupled grounded-base amplifier comprising first and second grounded-base amplifying circuits and a first bias circuit for applying a bias potential to said second grounded-base amplifying circuit, wherein said first bias circuit has the same configuration as an output stage of said first grounded-bases amplifying circuit; and
   a constant-current circuit for supplying a constant current to drive said direct-coupled grounded-base amplifier, said constant-current circuit comprising,
   a plurality of transistor whose bases are commonly connected,
   a second bias circuit for supplying a predetermined voltage to said bases of said transistors, and
   a drive circuit to which emitters of said transistors are connected.

3. A circuit device according to claim 2, wherein said drive circuit comprises a current mirror circuit.

4. A circuit device according to claim 3, wherein said second bias circuit and said plurality of transistors comprise a second current mirror circuit.

5. A circuit device according to claim 2, wherein said second bias circuit comprises a plurality of base-collector short-circuited transistors.

6. A circuit device according to claim 2, wherein said second bias circuit includes a first base-collector short-circuited transistor, a second transistor whose collector is connected to an emitter of said first transistor and a third transistor whose base is connected to the emitter of said first transistor.

7. A semiconductor integrated circuit device comprising a circuit device comprising:
   a direct-coupled grounded-base amplifier comprising first and second grounded-base amplifying circuits and a first bias circuit for applying a bias potential to said second grounded-base amplifying circuit,
   wherein said first bias circuit has the same configuration as an output stage of said first grounded-bases amplifying circuit; and
   a constant-current circuit for supplying a constant current to drive said direct-coupled grounded-base amplifier, said constant-current circuit comprising:
      a plurality of transistors whose bases are commonly connected,
      a second bias circuit for supplying a predetermined voltage to said bases of said transistors, and
      a drive circuit to which emitters of said transistors are connected, wherein said circuit device is arranged on a silicon substrate.

8. An apparatus comprising:
   signal processing means comprising a semiconductor integrated circuit device comprising a circuit device including,
      a direct-coupled grounded-base amplifier comprising first and second grounded-base amplifying circuits and a first bias circuit for applying a bias potential to said second grounded-base amplifying circuit,
      wherein said first bias circuit has the same configuration as an output stage of said first grounded-bases amplifying circuit; and
      a constant-current circuit for supplying a constant current to drive said direct-coupled grounded-base amplifier, said constant-current circuit comprising,
         a plurality of transistors whose bases are commonly connected,
         a second bias circuit for supplying a predetermined voltage to said bases of said transistors, and
         a drive circuit to which emitters of said transistors are connected, wherein said circuit device is arranged on a silicon substrate;
   supporting means for supporting a recording medium; and
   a head for recording and/or reproducing information on said recording medium.

* * * * *

UNITED STATES PATENT AND TRADEMARK OFFICE
CERTIFICATE OF CORRECTION

PATENT NO. : 5,126,689
DATED : June 30, 1992
INVENTOR(S) : HIROYUKI NAKAMURA

It is certified that error appears in the above-identified patent and that said Letters Patent is hereby corrected as shown below:

Title page:

IN [30] FOREIGN APPLICATION PRIORITY DATA

Insert: --Nov. 8, 1990 [JP] Japan ......... 2-301091--.

IN [56] REFERENCES CITED

Under Attorney, Agent, or Firm:
"Fitzpatrick Cella, Harper & Scinto" should read
--Fitzpatrick, Cella, Harper & Scinto--.

COLUMN 3

Line 58, "38" should read --3B--.
Line 66, "$A_{n1}$" should read --$Q_{n1}$--.

COLUMN 4

Line 1, "$A_{n1}$" should read --$Q_{n1}$--.
Line 50, "]$V_{BG}$" should read --[$V_{BG}$--.

COLUMN 7

Line 3, "shaped" should read --shaded--.

COLUMN 8

Line 43, "grounded-bases" should read --grounded-base--.
Line 48, "transistor" should read --transistors--.

COLUMN 9

Line 9, "grounded-bases" should read --grounded-base--.

UNITED STATES PATENT AND TRADEMARK OFFICE
CERTIFICATE OF CORRECTION

PATENT NO. : 5,126,689
DATED : June 30, 1992
INVENTOR(S) : HIROYUKI NAKAMURA

It is certified that error appears in the above-identified patent and that said Letters Patent is hereby corrected as shown below:

<u>COLUMN 10</u>

Line 8, "bases" should read --base--.

Signed and Sealed this

Ninth Day of November, 1993

Attest:

BRUCE LEHMAN

Attesting Officer     Commissioner of Patents and Trademarks